United States Patent [19]

Blackmer et al.

[11] 4,101,849
[45] Jul. 18, 1978

[54] ADAPTIVE FILTER

[75] Inventors: David E. Blackmer, Wilton; C. Rene Jaeger, South Lyndeboro, both of N.H.

[73] Assignee: DBX, Inc., Waltham, Mass.

[21] Appl. No.: 739,428

[22] Filed: Nov. 8, 1976

[51] Int. Cl.² ............................................. H04B 1/64
[52] U.S. Cl. ..................................... 333/14; 330/107; 330/126; 330/132; 330/133; 330/134; 330/144; 330/151
[58] Field of Search ....................... 333/14; 325/62, 65; 330/132, 133, 134, 149

[56] References Cited

U.S. PATENT DOCUMENTS

| 3,518,566 | 6/1970 | Vogel | 330/132 X |
| 3,681,618 | 8/1972 | Blackmer | 333/14 X |
| 3,735,290 | 5/1973 | Yamazaki | 333/14 |
| 3,798,562 | 3/1974 | Takahashi et al. | 333/14 X |
| 3,967,219 | 6/1976 | Dolby | 333/14 |

FOREIGN PATENT DOCUMENTS

| 1,385,493 | 2/1975 | United Kingdom | 333/14 |

*Primary Examiner*—Paul L. Gensler
*Attorney, Agent, or Firm*—Schiller & Pandiscio

[57] ABSTRACT

An adaptive signal weighting filter for use in a compander performs a frequency response weighting function so that during the encoding process the spectral region of dominant signal energy of the program signal is preemphasized with respect to other spectral regions and during the decoding process the corresponding spectral regions of the encoded signal are deemphasized with respect to one another in a complementary manner.

13 Claims, 8 Drawing Figures

ADAPTIVE FILTER

This invention relates to audio signal noise reducing systems and in particular to automatically variable bandpass systems utilizing compansion techniques.

Although many audio components now available contribute negligible noise and distortion in audio reproduction, a few components, notably FM broadcast and reception channels and tape recorder record and playback channels, contribute very noticeable noise when used as part of an audio reproduction system.

A commonly practiced technique for reducing the effect of channel noise is to encode the audio signal (usually by compressing the dynamic range of the signal) when recording or transmitting the signal and decoding the signal (usually by expanding the dynamic range of the compressed signal) when playing it back. This technique, commonly termed compansion, is illustrated, for example, in my U.S. Pat. No. 3,789,143 issued Jan. 29, 1974, on Compander with Control Signal Logarithmically Related to the Instantaneous RMS Value of the Input Signal. In compander noise reduction systems, the modulation of system noise by the audio signal, however, represents an important limit to perceived purity of sound. The most critical signals, with respect to noise modulation are those having relatively greater spectral purity, i.e., the dominant or greater part of the signal energy of the signal is concentrated in one part of the audio spectrum with very little energy or information in other portions. For example, when the audio signal contains dominant low frequency energy, such as a signal representing a low frequency piano note or a kettledrum, the audio signal, although tending to "mask" the low frequency portions of system noise, will also tend to modulate the mid-frequency and high frequency portions of system noise, producing a "hush-hush" or "breathing" effect in perceived sound. Similarly, an audio signal which includes dominant high frequency energy (such as that provided by a triangle) will tend to mask the high frequency noise but will modulate the low and mid-frequency portions of system noise producing an equally annoying modulation effect. A thorough discussion of masking of noise by tones is set forth by Young et al, *Journal of the Acoustical Society of America*, Vol. 41, No. 3 (1967) pp. 700-705.

Although known multi-band companding systems can reduce this problem significantly, they are complex, costly and multiply frequency response errors, making them impractical for consumer use. Further, such systems are undesirable since the control functions of the systems are usually determined by absolute signal levels.

It is therefore an object of the present invention to provide an audio noise reducing system which overcomes these disadvantages.

More specifically, one object of the present invention is to provide an adaptive signal weighting system incorporating a filter capable of altering according to a command signal the relationship of the spectral region of dominant energy in a signal to the other spectral regions of that signal, the command signal being generated as a function of the frequency of that dominant signal energy. Another object of the present invention is to provide a noise reduction encoding and decoding system having complementary tracking filters which dip or peak at the spectral region of dominant signal energy so as to adaptively weight this spectral region of the audio signal during the encoding and decoding process.

It is another object of the present invention to provide the necessary adaptive signal weighting to allow any audio signal which has its principal energy concentrated in one portion of the spectrum to be companded without "breathing" effects due to gain changes affecting the background noise of the recording medium.

Another object of the present invention is to provide a noise reduction encoding and decoding filtering system in which adaptive signal weighting is accomplished in a manner which is independent of the level setting requirements between the encoding and decoding systems.

And another object of the present invention to provide a relatively simple, inexpensive, audio signal noise-reducing system, the control functions of which are determined by signal ratios rather than absolute signal levels.

Still another object of the present invention is to provide an improved audio signal noise reducing system of the compander type which encodes the entire dynamic range of the audio signal altering selected portions of the audio spectrum prior to recording (or transmission) and decodes the entire range of the encoded signal altering corresponding portions of the signal with an exact complementary function upon playback.

Yet another object of the present invention is to provide an improved compander and method of reducing noise in the transmission of a signal, wherein gain control is proportionally derived from the rms value of the audio signal and the alteration of the low and high frequency portions of the audio spectrum not occupied by the signal is dependent on the midfrequency information.

These and other objects of the present invention are achieved by an adaptive signal weighting filtering system for encoding and decoding a program electrical input signal so as to improve the dynamic range of the input signal. The system includes a filter responsive to a control signal for altering the spectral region of dominant signal energy of the transmitted signal relative to other spectral regions of the transmitted signal by an amount determined in accordance with the control signal. Frequency discriminator means are also provided for sensing the spectral region of dominant signal energy in the transmittal signal and for providing the control signal as a function of frequency of the dominant signal energy. By using two such filtering systems in a complementary manner for encoding and decoding the transmitted signal, the spectral region of dominant signal energy can be preemphasized during encoding and deemphasized during decoding to reduce signal noise. The term "preemphasis" as used herein shall mean the alteration of the magnitude of select frequency components of an electrical signal with respect to the magnitude of others, to reduce noise in subsequent points of the system. The alteration can be in a negative sense wherein the magnitude of the select frequency components is suppressed, or the alteration can be in a positive sense wherein the magnitude of the select frequency components is enhanced. Similarly the term "deemphasis" shall mean the alteration of the select frequency components of the encoded signal in either a negative or positive sense in a complementary manner in which the original signal is altered. In its preferred embodiment the filtering system can be modified so as to employ compansion techniques.

Other objects of the invention will in part be obvious and will in part appear hereinafter. The invention accordingly comprises the processes involving the several steps and relations and order of one or more of such steps with respect to each of the others, and the apparatus possessing the construction, combination of elements and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein.

Figure 3:
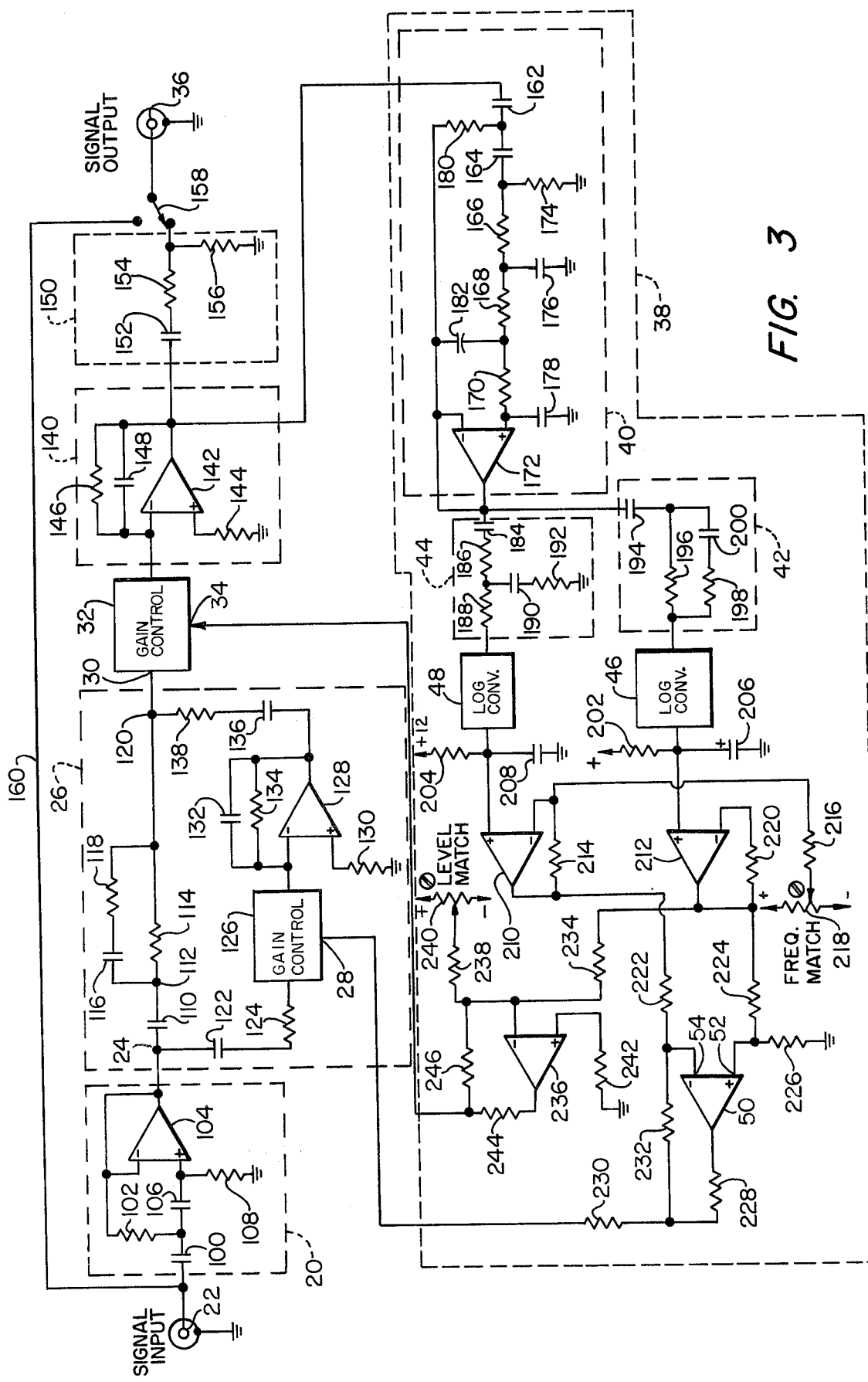
FIG. 3 is a circuit schematic of the system of FIG. 1.
Figure 4:
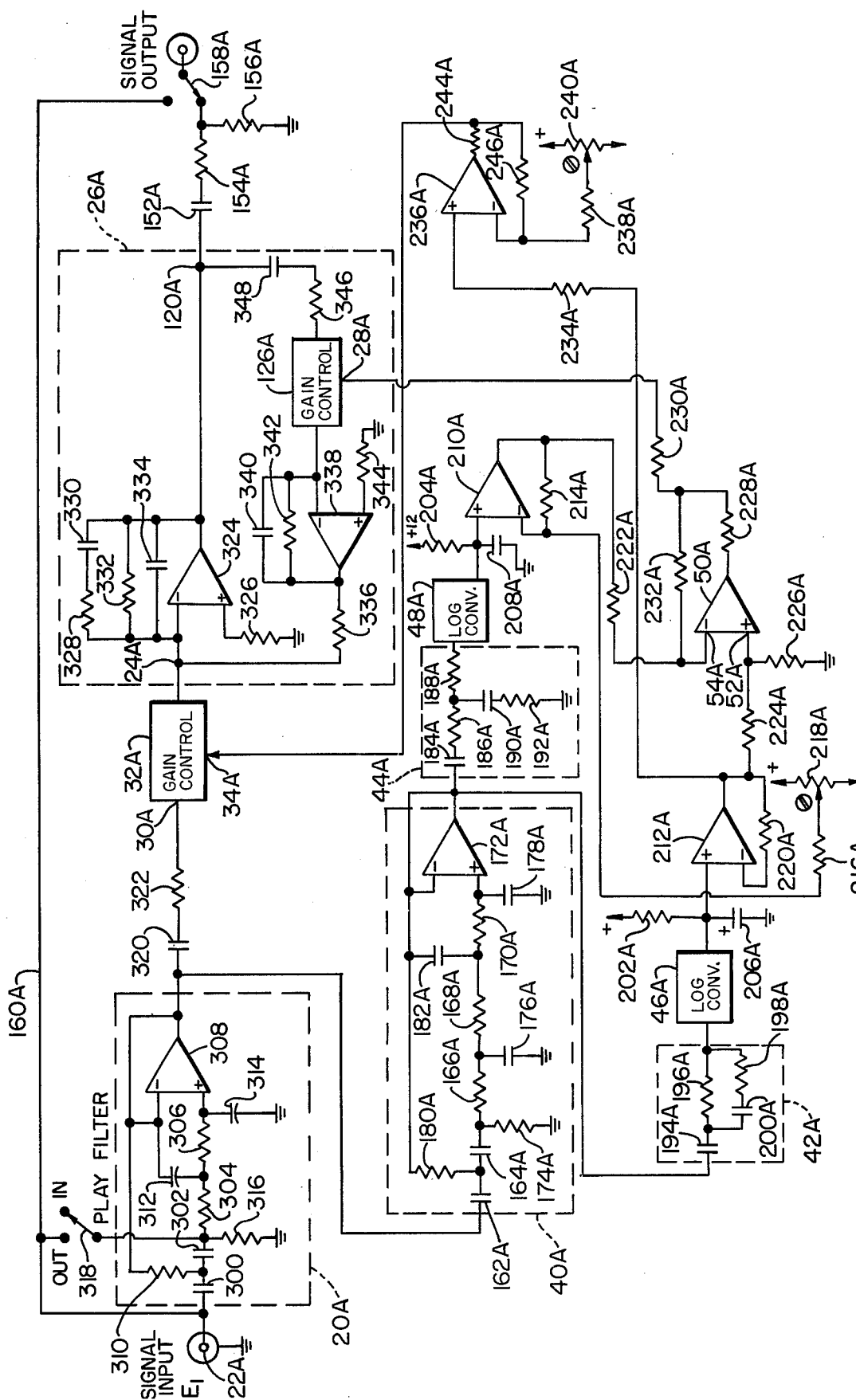
FIG. 4 is a circuit schematic of the system of FIG. 2.
Figure 6:
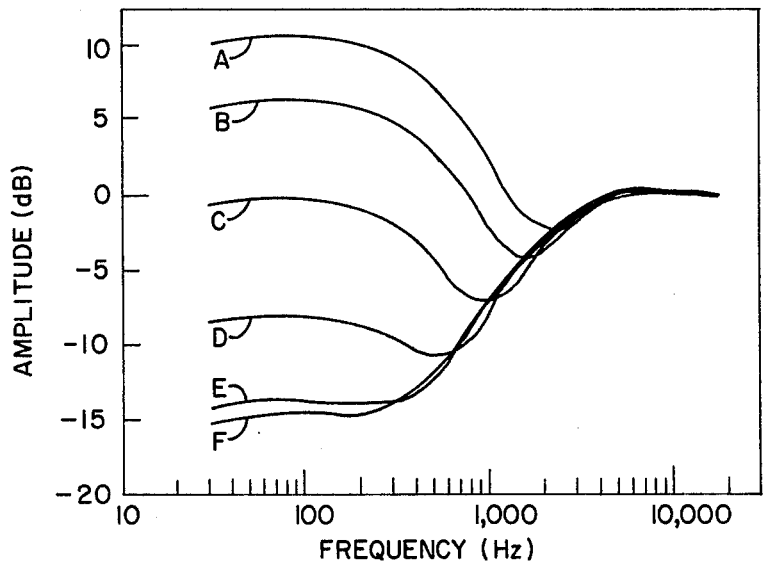
Figure 7:
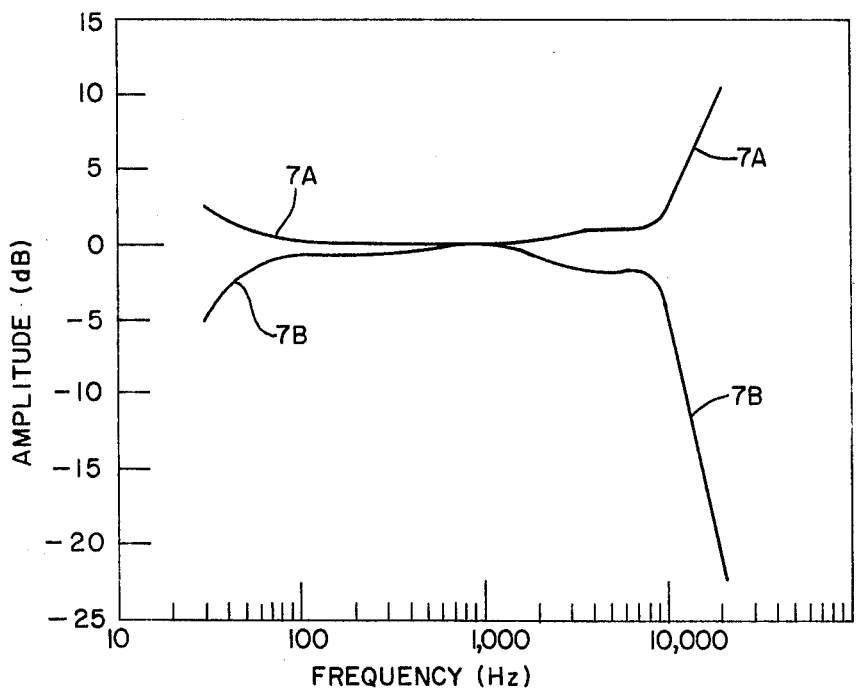

FIG. 6 illustrates a group of exemplary amplitude-frequency response curves for different audio signals having signal energy concentrated in various parts of the audio spectrum and explatory of the operation of the FIG. 3 embodiment; and FIG. 7 illustrates a pair of exemplary single-tone amplitude frequency response curves of the preferred encoding and decoding systems of FIGS. 3 and 4, respectively.

Signal noise reduction systems must make some provision for the extraordinary sensitivity of the human ear to noise far removed spectrally from the signal, especially if this noise is not constant. Systems employing compansion techniques which compand a signal having its principal energy concentrated in one portion of the spectrum will also produce "breathing" effects due to gain changes affecting the background noise of the recording medium.

If a line spectrum signal at, for example, 100 Hz were to vary in intensity with time on the recording medium, i.e., after compression, upon expansion, the noise in the 1–16 KHz region can be clearly heard to vary with the signal. The aforementioned paper by Young et al suggests that broad band gain modulated noise in this region can be perceived if it is 80dB under a 100dB SPL sine wave signal at 100 Hz. Magnetic recording tape which records at a speed of 19 cm/sec has broad band noise about 55dB under a 200 nW/m recording level. Disc recording is usually somewhat better than this with respect to continuous noise (as opposed to event noise such as ticks and pops). It is believed therefore that a 25dB weighting of the transmitted signal at the high end of the spectrum with somewhat less in the mid spectral region would be required to render noise modulation imperceptible at a 100dB SPL listening level. A somewhat lower weighting will be sufficient to render this noise nondegrading to signal quality.

In accordance with the present invention therefore, the signal output of the playback system is boosted or enhanced in the spectral region of strong spectrally concentrated signals. Accordingly, the signal must be suppressed in this spectral region in a complementary manner when recording.

More specifically, the present invention utilizes complementary tracking filters which alter in a complementary manner the transmitted signal at the frequency of dominant signal energy on recording and play back. Appropriate means are utilized to instruct these tracking filters to dip (suppress the signal) and peak (boost the signal) at the appropriate spectral energy center of the signal.

Figure 1:
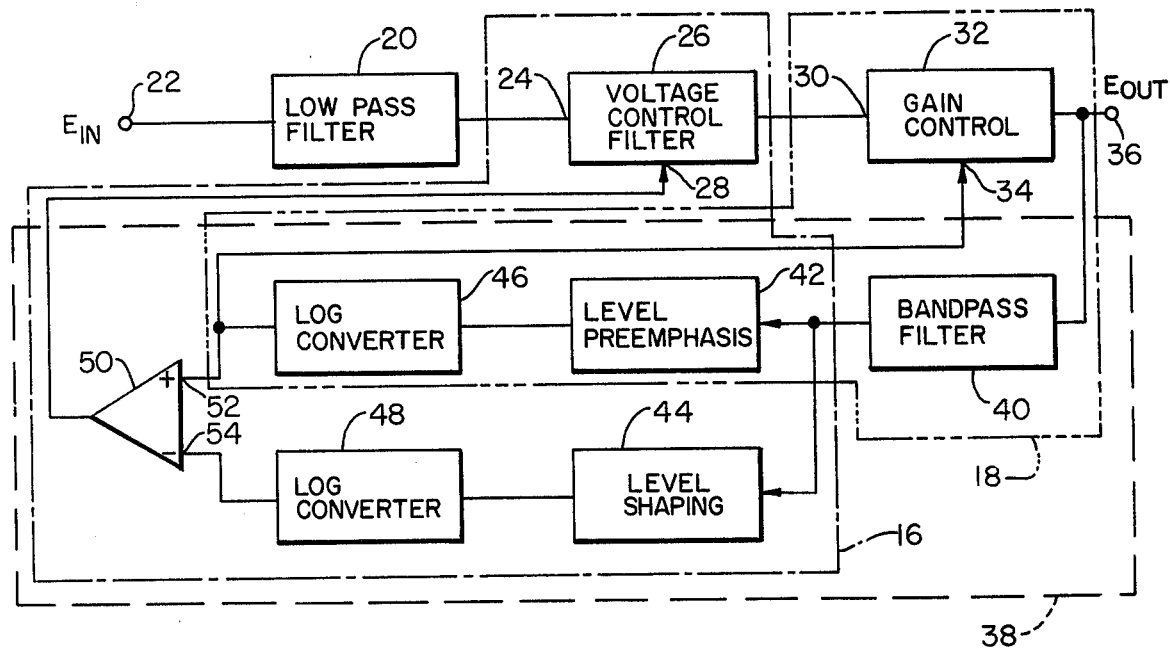
FIG. 1 is a block diagram of the preferred embodiment of the audio noise reduction encoding system embodying the principles of the present invention.
Figure 2:
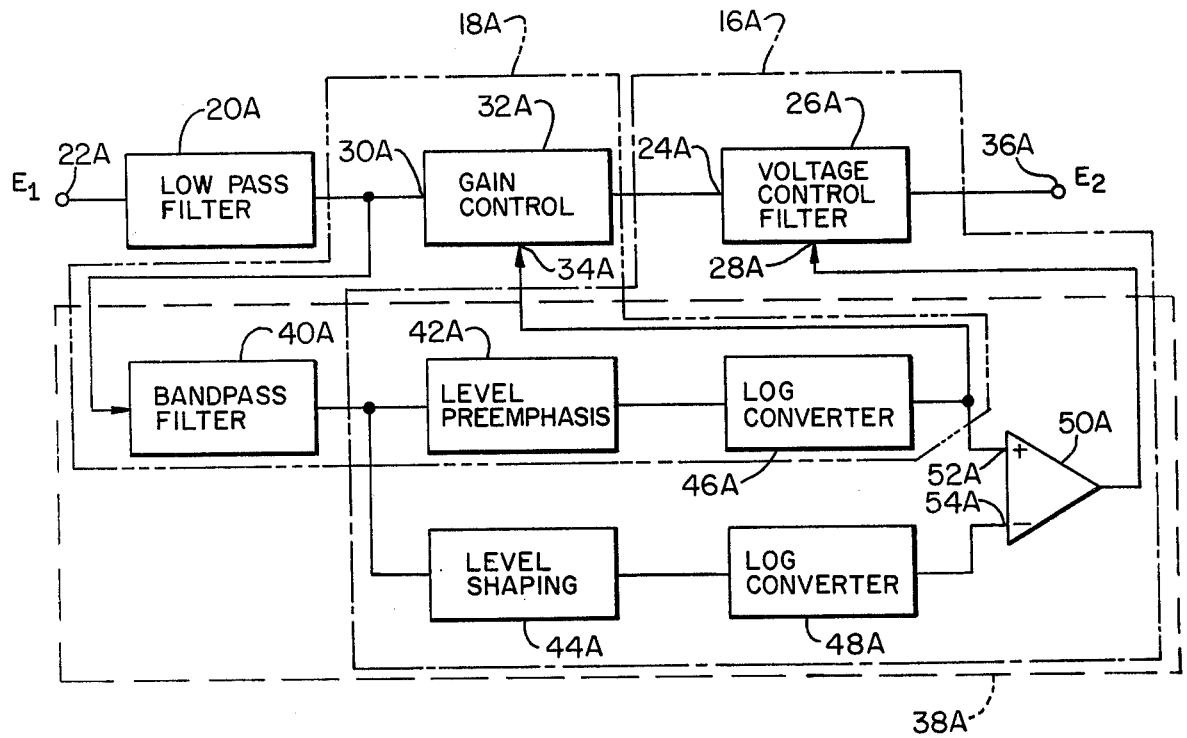
FIG. 2 is a block diagram of the preferred embodiment of a complementary audio noise reduction decoding system useful with the FIG. 1 system.

Referring to the drawings and in particular FIGS. 1 and 2, the preferred encoding and decoding systems shown are designed to improve the dynamic range of the audio electrical signal designated $E_{in}$, applied to the system input terminal 22. The encoding system of FIG. 1 generally includes the adaptive signal weighting filter, designated generally at 16, in which the incoming signal is altered in the spectral region of dominant signal energy. Similarly, the decoding system shown in FIG. 2 has a complementary tracking filter 16A which alters this spectral region of the dominant signal energy when decoding the signal. As will be evident hereinafter, the filters 16 and 16A can each be used with a gain control module to not only suppress and enhance the spectral region of dominant signal energy of the transmitted signal in a complementary manner but also to compress and expand the signal when respectively recording and playing back the signal.

Accordingly, the filter 16 can be used with a compressor, generally indicated at 18, to form a compressor system (see FIG. 1) for encoding an audio electrical signal, $E_{in}$, prior to transmission or recording, preemphasizing selected portions of the audio spectrum.

Similarily, the filter 16A can be used with an expander, generally indicated at 18A, to form an expansion system (see FIG. 2) for decoding and deemphasizing the encoded signal, $E_1$, applied to the system input terminal 22A upon playback.

The system of FIG. 1 comprises input buffer and lowpass filter 20 for limiting the bandwidth of the program information transmitted through the encoding system. The output of filter 20 is connected to system input terminal 24 of voltage control filter 26. Filter 26 is provided with control terminal 28 connected to the feedback control circuit 38, the latter being described in greater detail hereinafter. Generally, filter 26 is designed in accordance with the present invention to preemphasize the spectral region of the input signal $E_{in}$ of dominant signal energy with respect to other spectral portions of the input signal. The filter is preferably a continuously variable dip filter which exhibits a dip at the spectral region of dominant signal energy at any one instance of time. The output of filter 26 is connected to the input terminal 30 of the gain control module 32 of the compressor 18. The module is provided with control terminal 34 connected to feed-back control circuit 38. Gain control module 32 is similar to the gain control module of the compander described in my U.S. Pat. No. 3,789,143. Generally, module 32 amplifies the preemphasized signal output of the voltage control filter 26 by a variable gain responsive to the control signal applied to control terminal 34. A number of circuits are known that can control signal gain in response to a command or control signal. For example, one may use a light responsive resistance or a field effect transistor or an element in a voltage divider or known analog multipliers using balanced semiconductor pairs or the like. In any event, module 32 serves to control the gain impressed on the input signal in decibels in proportion to the control signal provided by feedback circuit 38 and thereby provides compression in which the input to output levels, in decibels, are related by a substantially constant factor which is lower than unity.

The output of module 32 is connected to system output terminal 36 and to feedback circuit 38. Feedback circuit 38, preferably detects the amount of signal energy in two spectral portions of the transmitted signal, compares the two amounts and provides a control signal which is responsive to this comparison. The input of the feedback circuit 38 includes a detector bandpass filter 40 which limits the bandwidth of the signals passing through circuit 38. The output of filter 40 is connected to both level preemphasis filter 42 and level shaping filter 44. Level preemphasis filter 42 is preferably of the type having a frequency characteristic curve such that the filter transmits the signal energy of select frequency portions of the signal transmitted through the filter. Level shaping filter 44, on the other hand, is preferably of the type having a frequency characteristic curve which is the inverse of the frequency characteristic curve of the filter 42, so as to transmit the signal energy of frequency portions of the signal not transmitted by filter 42. The outputs of filters 42 and 44 are connected to the inputs of identical log converter circuits 46 and 48, respectively. The latter, described in greater detail in my U.S. Pat. No. 3,789,143, each provide a D.C. output logarithmically related to the rms value of the signal provided by the respective filters 42 and 44 so that the D.C. output of circuit 46 is dependent on the energy content of the signal transmitted through filter 42 of the feedback circuit 38, while the D.C. output value of the circuit 48 is dependent on the energy content of the signal transmitted through filter 44.

As will be more evident hereinafter, the output of the circuit 46 is identical to the output of a single RMS circuit with a substantially flat frequency response in the frequency range determined by filter 42. Thus, the output is a measure of the level or amplitude of the energy of the transmitted signal at least within the frequency range determined by filter 42. Accordingly, the signal output of circuit 46 can be used to instruct or control the output of the compressor gain control module 32 in accordance with companion techniques. The output of circuit 46 is thus preferably connected to control terminal 34 of gain control module 32. In addition the output of the circuit is connected to the positive or direct input terminal 52 of differential amplifier 50. The negative or inverting input terminal 54 of amplifier 50 is connected with the output of circuit 48 while the output of the amplifier is connected to the control terminal 28 of the voltage control filter 26. Amplifier 50 is of a type well known in the art and generally provides a D.C. signal the value of which is dependent upon the voltage difference between the magnitude of the two signals applied at the two input terminals 52 and 54. As will be more evident hereinafter, the output of amplifier 50 responds to the energy ratio between the outputs of the two outputs of the circuits 46 and 48. The output of amplifier 50 is strictly frequency dependent so that mere changes of amplitude over the entire bandwidth of the input signal $E_{in}$, will cause the outputs of the two circuits 46 and 48 to increase an equal amount whereby the difference between the two remains the same. The output of amplifier 50 thus controls voltage control filter 26, which in turn effects the preemphasis of the input signal $E_{in}$. Further, the output of circuit 46 controls the gain of module 32 which in turn compresses the preemphasized signal output of filter 26 by a variable gain responsive to the output level of circuit 46.

Referring to FIG. 2, the decoding system includes generally the same elements as the encoding system of FIG. 1, modified and rearranged to the extent so as to provide a frequency signal weighting function substantially the complement of the weighting function of the encoding system of FIG. 1.

Thus, the system input terminal 22A (to which encoded input signal $E_1$ is applied) is connected to the input of the lowpass filter 20A, while the output of the latter is connected to both the input terminal 30A of gain control module 32A and to bandpass filter 40A of the feedforward path 38A. The output of gain control module 32A is connected to the input terminal 24A of voltage control filter 26A, and the output of filter 26A is connected to system output terminal 36A. The components of feedforward path 38A are arranged in an indentical fashion as feedback path 38 of the encoding system so that the output of bandpass filter 40A is connected to the input of both level preemphasis filter 42A and level shaping filter 44A. The outputs of filters 42A and 44A are connected to identical log converter circuits 46A and 48A, respectively. The outputs of converter circuits 46A and 48A are connected to the respective positive and negative input terminals 52A and 54A of differential amplifier 50A. The output of amplifier 50A is connected to control terminal 28A of voltage control filter 26A while the output of converter circuit 46A is also connected to control terminal 34A of gain control module 32A. The output of circuit 46A controls the gain of module 32A which in turn serves to control the gain impressed on the input signal applied to input terminal 30A in decibels in proportion to the control signal provided by feedforward circuit 38A and thereby provides expansion in which the input to output levels, in decibels, are related by a substantially constant factor which is greater than unity and which is substantially complementary, i.e., the inverse, of the ratio of the gain factor provided by module 32 of the FIG. 1 system. Further, the output of amplifier 50A controls voltage control filter 26A, which in turn effects the deemphasis of the input signal $E_1$ in a substantially complementary manner as the preemphasis provided by the system of FIG. 1 when encoding the input signal $E_{in}$.

In both instances of encoding and decoding the signals it will be appreciated that it is the compressed or encoded signal (the output of the encoding system of FIG. 1 and the input of the decoding system of FIG. 2) that is used to derive the various control signals.

Referring to FIGS. 3 and 4, the preferred encoding and decoding systems of FIGS. 1 and 2 are described in greater detail. Referring to FIG. 3, system input terminal 22 is connected to low-pass filter 20 which limits the bandwidth of the program information applied to terminal 22 and functions to buffer system input terminal 22 from the remaining portion of the system. Filter 20 includes input capacitor 100 which is connected through resistor 102 to the negative input terminal of operational amplifier 104, and connected through capacitor 106 to the positive input terminal of amplifier 104. The positive terminal of amplifier 104 is biased to system ground through biasing resistor 108 while negative input terminal is tied to the output of the amplifier in a manner well known in the art. The output of filter 20 is applied to input terminal 24 of voltage control filter 26.

Filter 26 comprises two parallel transmission paths for the signal output of filter 20. The first of these paths preferably has a substantially fixed transmission frequency range and preferably passes primarily only relatively high frequencies of the signal applied to terminal 24. This first path includes filtering capacitor 110 having one plate connected to input terminal 24 and its other plate connected through junction 112 to one side of resistor 114 and through junction 112 to capacitor 116. The latter in turn is connected to resistor 118 which in turn is connected with the other side of resistor 114 to output terminal 120 of voltage control filter 26.

The second transmission path preferably transmits over a frequency range, (preferably including relatively low frequencies) which is variable responsively to the amplitude control signal applied to control terminal 28 of filter 26. This second path includes input capacitor 122 connected in series with input resistor 124 to the input terminal of gain control module 126. Module 126 is equivalent to modules 32, and 32A previously described, and thus will not be described in great detail. Generally, module 126 amplifies the portion of the signal applied to the input terminal of the module 126 by a gain variable responsive to the control signal applied to control terminal 28. The gain impressed on the input signal applied to the input of module 126, which when expressed as a ratio of the input to output levels, in decibels, is substantially a factor which can be less than unity, providing compression; equal to unity providing unity gain; or greater than unity, providing expansion. The output of gain control module 126 is applied to the negative input terminal of operational amplifier 128. The positive terminal of amplifier 128 is biased through resistor 130 to system ground, while the negative terminal of amplifier 128 is connected through feedback capacitor 132 and through feedback resistor 134, (connected in parallel with capacitor 132) to the output of the amplifier. The output of amplifier 128 is connected to capacitor 136, which in turn is connected through resistor 138 to output terminal 120. As described, filter 26 includes a first path (defined by capacitors 110 and 116 and resistors 114 and 118) of a fixed transmission frequency range substantially including only the relatively high frequency portions of the signal appearing at input terminal 24; and a second path (defined by capacitors 122 and 132, resistors 124 and 134, gain control module 126 and operational amplifier 128) whose transmission frequency range substantially includes only the relatively low frequency portions of the signal appearing at input terminal 24. Depending on the magnitude of the control signal applied to control terminal 28, the gain of the low frequency signal transmitted over the second path varies which in turn varies the transmission frequency range of the second path.

Figure 5A:
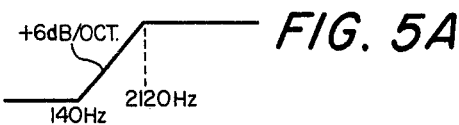
FIGS. 5A and 5B illustrate two exemplary idealized amplitude frequency response curves of the low and high frequency paths respectively of the voltage control filter of the preferred embodiment of FIG. 3.

Generally, as will be more evident hereinafter in connection with the description of the operation of the system with reference to FIG. 5, when the signal applied to input terminal 24 contains dominant high frequency information, i.e., more information in the high frequency portion of the spectrum relative to the information in the low frequency portion, a relatively large signal is applied to control terminal 28, setting the gain of module 126 (which gain will be greater than unity) so as to boost the low frequency portions of the signal transmitted over the second path relative to the dominant high frequency portions of the signal transmitted over the first path. Conversely, when the signal applied to input terminal 24 contains dominant low frequency information, i.e., more information in the low frequency portion of the spectrum relative to the information applied to control terminal 28, the gain of module 126 (which gain will be less than unity) is set so as to supress the low frequency portions of the signal transmitted over the second path relative to the high frequency portions the signal transmitted over the first path. The signals transmitted over the two paths are joined at output terminal 120 whereupon they are applied to input terminal 30 of gain control module 32, as previously described. The signal, preemphasized by filter 26 is then amplified by a gain which varies in accordance with the magnitude of the control signal applied to control terminal 34. The output of module 32 is applied to output buffer 140. Buffer 140 includes a current-to-voltage converter in the form of operational amplifier 142 having its positive terminal biased to system ground through resistor 144 and its negative input teminal connected to the output of module 32 as well as to its own output through feedback resistor 146 and capacitor 148 (the latter two being connected in parallel with one another).

The output of buffer 140 is connected through an output network 150 to system output terminal 36. Network 150 includes input capacitor 152 connected in series with resistor 154 which, in turn, is connected through biasing resistor 156 to system ground and is connected to a pole of by-pass switch 158. The latter is connected to system output terminal 36 and when placed in a first position as shown in FIG. 3, electrically connects the noise reduction system between system input terminal 22 and system output terminal 36, and in a second position wherein input terminal 22 is short-circuited to output terminal 36 through the line 160, by-passing the noise reduction system.

The output of buffer 140 is also connected to bandpass filter 40 of feedback circuit 38. Preferably, bandpass filter 40 is designed to transmit primarily those portions of the signal between about 30 Hz and 10KHz although this may vary. Filter 40 includes input capacitor 162 connected through resistor 180 to the negative input terminal of operational amplifier 172 and through a series arrangement of capacitor 164 and resistors 166, 168, and 170, to the positive input of amplifier 172. The junction between capacitor 164 and resistor 166 is biased to system ground through resistor 174, while the junction between resistors 166 and 168 is connected to system ground through capacitor 176 and the positive input terminal of amplifier 172 is connected to system ground through capacitor 178. The negative input terminal of amplifier 172 is connected through capacitor 182 to the junction between resistors 168 and 170 and is also tied to the output of the amplifier.

The output of filter 40 is connected to the inputs of level preemphasis filter 42 and level shaping filter 44. Level preemphasis filter 42 is generally a high pass filter which primarily passes the relatively high frequency portions of the signal output of filter 40, while level shaping filter 44 is generally a low pass filter which primarily passes the relatively low frequency portions of the signal output of filter 40. More specifically, the preferred level preemphasis filter 42, includes input capacitor 194 connected through resistor 196, series resistor 198 and capacitor 200 to the output of the filter. Level shaping filter 44 preferably includes input capacitor 184 which is connected in series with resistor 186 which in turn is connected in series through resistor 188 to the output of the filter. A shunting capacitor 190 in series with resistor 192 connects the junction of resistors 186 and 188 to ground. The outputs of filters 42 and 44 are connected to the inputs of log converter circuits 46 and 48, respectively. The circuits 46 and 48 operate as previously described to provide a D.C. output, logarithmically related to the rms value of the signal provided by the outputs of the corresponding filters 42 and 44. The magnitude of the D.C. output circuit 46 is thus primarily dependent on high frequency information transmitted through bandpass filter 40 while the magnitude of the D.C. output of circuit 48 is primarily dependent on low frequency information. By choosing the proper values of the individual parts of level preemphasis and shaping filters 42 and 44 the amplitude frequency output response curves can be substantially complementary to one another, as will be more evident hereinafter.

The outputs of circuits 46 and 48 are biased by a positive D.C. voltage through resistors 202 and 204, respectively and connected to system ground through capacitors 206 and 208, respectively. Further, the output of circuit 48 is connected to the positive input terminal of buffer amplifier 210, and the output of circuit 46 is connected to the positive input terminal of buffer amplifier 212. The negative input terminal of amplifier 210 is connected to its output through feedback resistor 214 and is connected through resistor 216 to the tap of potentiometer 218. Additionally, the output of amplifier 212 is connected through resistors 234 and 238 to the tap of potentiometer 240. Potentiometers 218 and 240 are provided so that the corresponding output of amplifiers 210 and 236 can be adjusted to insure that their amplitude frequency responses are the complement of one another.

The negative input terminal of amplifier 212 is tied to its output through feedback resistor 220.

The output of amplifier 210 is connected through resistor 222 to the negative input terminal 54 of differential amplifier 50, previously described. The output of amplifier 212 is connected through feedback resistor 220 to its negative input terminal and through resistor 224 to the positive terminal 52 of amplifier 50. The output of amplifier 50 is connected through resistor 228 and 230 to the control terminal 28 of gain control module 126. A feedback resistor 232 is also provided between the negative input terminal 54 of amplifier 50 and the junction between resistors 228 and 230. Differential amplifier 50, thus, generally compares the difference in magnitude between the D.C. outputs of buffer amplifiers 210 and 212 and provides an output signal which is related to the difference and thus related to the frequency of dominant energy presented to detectors 46 and 48 from filter 40.

In addition, the output of amplifier 212 is preferably connected through resistor 234 to the negative input of inverting amplifier 236. The positive input terminal of amplifier 236 is biased to system ground through resistor 242. The output of amplifier 236 is connected through resistor 244 to control terminal 34 of module 32 and to feedback resistor 246, which in turn is connected to the negative input terminal of amplifier 236. Amplifier 236 generally inverts the signal output of the signal applied to its negative input terminal from buffer amplifier 212 so as to provide a control signal to control terminal 34 of module 32.

Referring to FIG. 4, the decoding system shown is similar to the encoding system of FIG. 3, except that the former preferably deemphasizes low frequency portions of the encoded signal $E_1$, provided by the encoding system in accordance with a frequency weighting function which is the substantial complement of the frequency weighting function provided during the encoding process. Specifically, input terminal 22A is connected to low-pass filter 20A. The latter is designed to limit the bandwidth of the encoded signal $E_1$ applied to terminal 22A and to buffer terminal 22A from the remaining portion of the system. Filter 20A is slightly modified from filter 20 and includes input capacitor 300 which is connected through capacitor 302 and resistors 304 and 306 to the positive input terminal of operational amplifier 308. The junction between capacitors 300 and 302 is connected through resistor 310 to both the negative input terminal and the output of amplifier 308. Capacitor 312 is connected between the junction of resistors 304 and 306 on the one hand and the negative input terminal of amplifier 308 on the other hand. Capacitor 314 is connected between the positive input terminal of amplifier 308 and system ground. The junction of capacitor 302 and resistor 304 is connected through resistor 316 to system ground and is also connected to the contact arm of switch 318. The contact arm is movable between a first position wherein the junction between capacitor 302 and resistor 304 is connected to line 160A, and a second position wherein the junction is not connected to the line 160A.

The output of filter 20A is connected to the feed forward circuit 38A, the latter being identical to feedback circuit 38. The output of filter 20A is also connected through capacitor 320 to resistor 322, which in turn is connected to input terminal 30A of gain control module 32A. Module 32A is identical to module 32 of FIG. 3 and thus also will not be described in detail. The control terminal 34A of module 32A is connected to the junction of resistors 244A and 246A at the output of amplifier 236A so that module 32A receives a control signal from feedforward circuit 38A in a similar manner as described with reference to module 32 in FIG. 3. The gain provided by module 32A, however, is the substantial complement of the gain provided by module 32. Thus, where module 32 compresses the signal during the encoding process, module 32A expands the signal during the decoding process back to its original level. The output of module 32A is connected to the input terminal 24A of voltage control filter 26A. The latter substantially provides the exact complementary weighting function to the weighting function provided by filter 26 of the FIG. 3 encoding system so that when the filter 26 of FIG. 3 boosts the low frequency portion of the input signal Ein with respect to the high frequency portions, filter 26A suppresses in a complementary manner the corresponding low frequency portions of the encoded input signal $E_1$ with respect to the correspnding high frequency portions. Filter 26A comprises two parallel transmission paths for the signal output of module 32A and applied to input 24A. The first of these paths preferably has a substantially fixed transmission frequency range and preferably passes primarily only relatively high frequencies of the signal applied to input terminal 24A. This first path includes an operational amplifier 324 having its negative input terminal connected to input terminal 24A of filter 26A and its positive input terminal connected to system ground through resistor 326. Three feedback paths are provided between the negative input terminal and output of amplifier 324. The first consists of resistor 328 connected in series with capacitor 330, the second consists of resistor 332 and the third consists of capacitor 334. The output of amplifier 324 is also connected to input terminal 120A of filter 26A.

The second transmission path, a feedback path around amplifier 324, transmits over a frequency range (preferably primarily consisting of relatively low frequencies) which is variable responsively to the amplitude control signal applied to the control terminal 28A of filter 26A. This second path includes an input capacitor 348 having one plate connected to the output of amplifier 324 and the other to resistor 346. The latter in turn is connected to the input of gain control module 126A. The output of module 126A is connected to the negative input terminal of amplifier 338 and through capacitor 340 and and resistor 342 (the latter two being connected in parallel) to the output of amplifier 338. The positive input terminal of amplifier 338 is connected through resistor 344 to system ground while the output of the amplifier is connected through resistor 336 to input terminal 24A of filter 26A.

Gain control module 126A is identical to module 126 of FIG. 3 and thus will not be described in detail. The control terminal 28A of module 126A is connected to feed forward circuit 38A through resistor 230A to the junction of resistors 228A and 232A at the output of differential amplifier 50A so that module 126A receives a control signal from feedforward circuit 38A in a similar manner as described with reference to module 126A in FIG. 3. The gain provided by module 126A, however, is substantially the complement of the gain provided by module 126. Depending on the magnitude of the control signal applied to control terminal 28A, the gain of the low frequency signals transmitted over the second path varies as the complement of the gain provided by the corresponding path during the encoding process. This has the effect of varying the transmission frequency range of the second path of the decoding system so as to restore the low frequency portions of the signal relative to the high frequency portions of the signal, as they were when applied at the input terminal 22 of the encoding system of FIG. 3, without modulating the noise at the frequencies having little or none of the signal energy.

In the preferred embodiment the various resistors and capacitors referred to in FIGS. 3 and 4 have the values as shown in Table I.

TABLE I

| ELEMENT | VALUE | ELEMENT | VALUE |
| --- | --- | --- | --- |
| C100 | 0.1 nf | R154 & R154A | 0.1 K |
| R102 | 51 K | R156 & R156A | 100 K |
| C106 | 0.1 nf | C162 & C162A | 0.1 nf |
| R108 | 120 K | C164 & C164A | 0.1 nf |
| C110 | 0.1 nf | R166 & R166A | 5.1 K |
| R114 | 1 M | R168 & R168A | 15 K |
| C116 | 1 nf | R170 & R170A | 15 K |
| R118 | 75 K | R174 & R174A | 100 K |
| C122 | 0.33 nf | C176 & C176A | 3.3 nf |
| R124 | 100 K | C178 & C178A | 330 pf |
| R130 | 1 K | R180 & R180A | 30 K |
| C132 | 3.3 nf | C182 & C182A | 3.3 nf |
| R134 | 100 K | C184 & C184A | 0.1 nf |
| C136 | 0.33 nf | R186 & R186A | 20 K |
| R138 | 75 K | R188 & R188A | 20 K |
| R144 | 1 K | C190 & C190A | 0.033 nf |
| R146 | 100 K | R192 & R192A | 3.3 K |
| C148 | 15 pf | C194 & C194A | 0.033 nf |
| C152 & C152A | 4.7 nf | R196 & R196A | 100 K |
| R198 & R198A | 33 K | R306 | 10 K |
| C200 & C200A | 3.3 nf | R310 | 30 K |
| R202 & R202A | 750 K | C312 | 1 nf |
| R204 & R204A | 750 K | C314 | 330 pf |
| C206 & C206A | 20 nf | R316 | 100 K |
| C208 & C208A | 20 nf | C320 | 0.33 uf |
| R214 & R214A | 1 K | R322 | 100 K |

TABLE I-continued

| ELEMENT | VALUE | ELEMENT | VALUE |
| --- | --- | --- | --- |
| R216 & R216A | 330 K | R326 | 1 K |
| R218 & R218A | 50 K | R328 | 75 K |
| R220 & R220A | 1 K | C330 | 1 nf |
| R222 & R222A | 10 K | R332 | 1 M |
| R224 & R224A | 10 K | C334 | 15 pf |
| R226 & R226A | 100 K | R336 | 75 K |
| R228 & R228A | 1 K | C340 | 3.3 nf |
| R230 & R230A | 2.7 K | R342 | 100 K |
| R232 & R232A | 100 K | R344 | 1 K |
| R234 & R234A | 5.1 K | R346 | 100 K |
| R238 & R238A | 1 M | C348 | 0.33 nf |
| R240 & R240A | 50 K | | |
| R242 & R242A | 1 K | | |
| R244 & R244A | 1 K | | |
| R246 & R246A | 5.1 K | | |
| C300 | 0.1 uf | | |
| C302 | 0.1 uf | | |
| R304 | 10 K | | | wherein the prefix R and C designate respectively, a resistor and capacitor to which the particular numeral refers to; uf refers to microfarads; nf refers to nanofarads; pf refers to picofarads; K refers to kilohms, and M refers to megohms.

With these values for each of the resistors and capacitors shown in FIGS. 3 and 4, the amplitude-frequency responses of the filters and the operation of the device can be described with reference to FIGS. 5 - 7.

When encoding the input signal applied to input terminal 22 of the FIG. 3 encoding system, the signal is transmitted through lowpass filter 20 which filters out frequencies above about 30KHz to input terminal 24 of voltage control filter 26. The transmission over the first path defined by capacitors 110 and 116 and resistors 114 and 118 includes primarily the high frequency portion of the signal applied to terminal 24 and is shown ideally in FIG. 5A. The transmission path begins transmitting at a frequency of about 140 Hz, rising at about +6db/oct to 2120 Hz where it levels off. The amplitude-frequency response curve remains relatively the same regardless of the energy content of the input signal Ein.

Figure 5B:
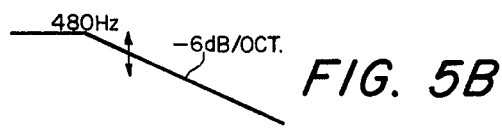

On the other hand, the transmission over the second path defined by capacitors 122, 132 and 136, resistors 124, 134 and 138, gain control module 126 and amplifier 128 includes primarily the low frequency energy portion of the signal applied to terminal 24 and is roughly shown in FIG. 5B. The transmission path transmits all frequencies below about 480 Hz when the amplitude-frequency response curve drops at a rate of −6db/oct. The amplitude of this curve shifts in amplitude when there is a change in the energy frequency-distribution of the input signal over generally the entire frequency range. However, the amplitude response curve also shifts with changes in the gain provided by gain control module 126 so as to shift the transmission level of the path. Thus when the transmission paths are combined at terminal 120, the amplitude of the lower frequency portion of the signal at terminal 120 varies with respect to the high frequency component depending upon the gain provided by gain control module 126.

The gain of gain control module 126 is dependent upon the D.C. output of differential amplifier 50 which in turn is dependent upon the outputs of amplifiers 210 and 212, the output of the latter being dependent upon the outputs of log converter circuits 48 and 46, respectively. The output of log converter circuit 46 is derived primarily from the high frequency information while the output of log converter circuit 48 is derived primarily from the low frequency information contained in the signal applied to the feedback circuit 38. Thus when the D.C. output of amplifier 212 is greater than the D.C. output of amplifier 210 indicating a greater amount of energy is present in the high frequency portion of the signal than in the low frequency portion, the output of amplifier 50 will be a positive D.C. signal, the magnitude of which is dependent upon the magnitude applied to the input terminal of the amplifier. The positive D.C. output of amplifier 50 is applied to the control terminal 28 of gain control module 126 so that the latter provides a gain greater than unity and the low frequency energy is boosted with respect to the high frequency energy. The output of terminal 120 has an amplitude-frequency response curve which may resemble curves 6A or 6B shown in FIG. 6. Curves 6A and 6b show the frequency-amplitude response curves of two input signals having the dominant energy at 10 KHz and 2 KHz, respectively.

When the outputs of amplifiers 210 and 212 are substantially equal, indicating that an equal amount of energy exists in both the high and low frequency portions of the signal, the input signal applied to the inputs of amplifier 50 will be equal. The output of amplifier 50 will therefore, be such that module 126 provides unity gain, so that the low frequency information is neither boosted or suppressed with respect to the high frequency response curve similar to curve 6C in FIG. 6. Curve 6C shows the frequency-amplitude response curve of an input signal having its dominant energy at 1KHz. As shown this curve 6C occurs at unity gain when the energy content of the high and low frequency portions of the signal are about equal while a minimum is provided of about −6db at 1 KHz. This is significant since the inputs to amplifier 50 are dependent upon the amount of energy in the signal applied to the feedback path 38 in the frequency range of 140 and 2120 Hz, (generally considered to be midfrequencies where most of the energy is typically present in program input signals) while the effect on the signal is at a minimum between these frequencies as shown by curve 6C.

Finally, when the output of amplifier 212 is less than the output of amplifier 210, indicating a greater amount of energy is present in the low frequency portion of the signal than in the high frequency portion, the output of amplifier 50 will be a negative D.C. signal the magnitude of which is dependent upon the magnitude of the difference in magnitudes of the signal applied to the input terminals of the amplifier. The negative D.C. output signal of amplifier 50 is applied to the control terminal 28 of gain control module 126 so that the latter provides a gain less than unity and the low frequency energy is suppressed with respect to the high frequency energy. In such a situation, the output at terminal 120 has an amplitude-frequency response curve similar to curves 6D, 6E, or 6F, shown in FIG. 6. Curves 6D, 6E and 6F show the frequency-amplitude response curves of three input signals having its dominant energy at 500 Hz, 200 Hz and 50 Hz, respectively.

After the input signal is preemphasized by filter 26 the signal is compressed by gain control module 32 in a similar manner as described in my U.S. Pat. No. 3,789,143 issued Jan. 29, 1974. Specifically, module 32 senses the output of filter 26 and serves to control the gain impressed on the output in proportion to the control signal provided at control terminal 34 from the output of amplifier 236 of feedback circuit 38. Module 32 thereby provides compression in which the input to output levels, in decibels, are related by a substantially constant factor which is lower than unity. It is noted that the control signal applied to module 32 is derived from the high frequency energy of the signal and thus is not effected by the variable gain provided by the filter 26, and since the variable gain of filter 26 only effects the low frequency portion of the signal, the transmission of the high frequency portion of the signal is substantially independent of the energy content of the signal transmitted through the filter.

When playing back the encoded signal output of the encoder described in FIG. 3, through the decoder of FIG. 4, the encoded signal is treated in a complementary fashion to provide a decoded signal. The feedforward circuit 38A operates in the same manner as feedback circuit 38 so that where the low frequency energy is altered with respect to the high frequency energy of the program input signal during the encoding process, the low frequency energy of the encoded signal will be altered with respect to the high frequency energy during the decoding process in a complementary manner. Further, where the program input signal is compressed by the gain control module 32 during the encoding process, the encoded signal is expanded in a complementary manner by the gain control module 32A during the decoding or playback.

A typical single tone response of the encoding and decoding systems described is shown in FIG. 7. Curve 7A illustrates an encoded signal provided at the output terminal 36 of the encoder when a single tone program input signal is applied to the input terminal 22. When a single tone signal is applied through the input terminal 22A of the decoder, the output amplitude-frequency response is similar to that shown in curve 7B. A single tone program signal applied through an encoder and decoder serially will produce an essentially flat frequency-amplitude plot.

The encoding and decoding systems thus described, provide a system which reduces noise modulation in an inexpensive and simple manner without multiplying frequency response errors.

It will be appreciated that the filters 16 and 16A can be used without compressing and expanding the transmitted signal by merely removing the gain control module 32 of the encoder of FIG. 1 and connecting the output of filter 26 directly to the output terminal 36 and the input of bandpass filter 40 of the feedback circuit 38. Similarly, gain control module 32A of the decoder of FIG. 2 can be removed and the output of bandpass filter 20A connected directly to the input of voltage control filter 26A as well as the input of bandpass filter 40A of feedforward circuit 38A. The filters will provide a noise reduction system by preemphasizing the spectral portion of dominant signal energy of the transmitted signal when encoded and deemphasizing the encoded signal in a complementary manner when playing the encoded signal back. The nature of the level preemphasis filters 42 and 42A and the log converter circuits 46 and 46A thus serve two functions in the compander of FIGS. 1 and 2, i.e., as a detector or frequency discriminator of one spectral portion of the transmitted signal to produce the control signal applied to the control terminal 28 and 28A and as a control signal for controlling the gain control module 32 and 32A.

The present invention thus described provides a noise reduction encoding and decoding filtering system in which adaptive signal weighting is accomplished in a manner which is independent of the level setting requirements between encoding or decoding systems.

Further all the control functions of the system are determined by signal ratios rather than absolute values. Specifically, the gain control of the present invention is proportionally derived from the rms value of the audio input signal. Also, the relative preemphasis of the low and high frequency portions of the audio spectrum of the signal is dependent on the mid-frequency information where most of the signal is usually present. Specifically, in the preferred form of the invention, as illustrated, the portion of the curve of FIG. 5A slopes between 140 Hz and 2120 Hz, while the curve of FIG. 5B begins to drop at 480 Hz. Further, the gain provided by module 32 is dependent upon the high frequency energy of the signal which is substantially independent of the amount of preemphasis of the low frequency energy.

Various changes may be made in the present invention, without departing from the invention. For example, instead of the low frequency energy of the input being preemphasized with respect to the high frequency energy during encoding and a complementary deemphasis on playback, the transmisstion range of low frequency path of the voltage control filters 26 and 26A can be fixed, while the high frequency response of the other path is made variable. In such a situation, the low frequency component of the signal (derived from amplifiers 210 and 210A) would be applied to control terminal 34 and 34A, respectively of the corresponding gain control modules 32 and 32A.

Since certain other changes may be made in the present invention without departing from the scope of the invention herein involved, it is intended that all matter contained in the above description or shown in the accompanying drawing, shall be interpreted in an illustrative and not in a limiting sense.

What is claimed is:

1. A companding system for use in signal transmission of an encoded signal derived from an electrical input signal, said system comprising, in combination:
    an input terminal;
    an output terminal;
    means coupled between said input and output terminals for providing a pair of parallel transmission paths, the first of said paths having a substantially fixed transmission frequency range, the second of said paths providing transmission over a frequency range which is variable responsively to the amplitude of a first control signal, the frequency transmission characteristic of one of said two paths being within a relatively high range of frequencies and the frequency transmission characteristic of the other of said two paths being within a range of relatively low frequencies;
    means for combining the output of said two paths to provide a combined signal along a single path;
    means for sensing the amplitude of selected relatively low frequency components of said encoded signal and for providing a second variable control signal logarithmically related to the rms value of the amplitude of said relatively low frequency components;
    means for sensing the amplitude of selected relatively high frequency components of said encoded signal and for providing a third variable control signal logarithmically related to the rms value of the amplitude of said relatively high frequency components;
    means for comparing said second and third control signals so as to provide said first control signal related to the comparison of said second and third control signals; and
    amplifying means coupled between said input and output terminals in series with said parallel transmission paths having a gain variable responsively to the one of said second and third control signals which is logarithmically related to the rms value of the amplitude of the frequency components which correspond to the transmission frequency range of the first of said paths.

2. A system in accordance with claim 1, wherein the frequency transmission characteristic of the first of said paths is within a range of relatively high frequencies, the frequency transmission characteristic of the second of said paths is within a range of relatively low frequencies, and said amplifying means is responsive to said second control signal.

3. A system in accordance with claim 2, wherein said amplifying means is adapted to amplify said combined signal and said encoded signal is derived from the output of said amplifying means.

4. A system in accordance with claim 2, wherein said input terminal is adapted to receive said encoded signal and said means for providing said pair of parallel transmission paths is adapted to receive the output of said amplifying means.

5. A system in accordance with claim 2, wherein said amplifying means is such that, expressing the levels of an input signal amplified by said amplifying means and the output signal of said amplifying means in decibels, said output signal is linearly related to said input signal.

6. A system in accordance with claim 2, wherein said second path includes means for amplifying the low frequency portion of said signal transmitted over said second path by a gain variable responsively to said first control signal.

7. A system in accordance with claim 2, wherein said first control signal is a D.C. signal, the amplitude of which is dependent upon the energy in the middle frequency portion of said electrical input signal.

8. In a compression and expansion system for encoding and decoding an electrical input signal so as to improve the dynamic range of said input signal, said system being of the type including means for sensing the amplitude of said input signal and for providing a variable D.C. control signal logarithmically related to the rms value of the amplitude of said input signal and means for amplifying said input signal by a gain variable responsively to said control signal, wherein the improvement comprises first means for preemphasizing low frequency portions of said input signal relative to high frequency portions of the input signal during the compression of said input signal, in accordance with a first gain control function dependent upon the amount of signal energy in said low frequency portions relative to said high frequency portions so as to provide a frequency resonse weighted encoded signal and second means for deemphasizing the corresponding low frequency portions of the encoded signal relative to the corresponding high frequency portions of the encoded signal during expansion of said encoded signal, in accordance with a second gain control function which is substantially the complement of said first gain control function.

9. In the system of claim 8, wherein said first means for preemphasizing includes means for separating said input signal into said low frequency portions and said high frequency portions, means for sensing the amplitude of selected relatively low frequency components of said encoded signal and for providing a second variable control signal logarithmically related to the RMS value of the amplitude of said relatively low frequency components, means for sensing the amplitude of selected high frequency components of said encoded signal, means for providing a third variable control signal logarithmically related to the RMS value of the amplitude of said relatively high frequency components, and means for comparing said second and third control signals so as to provide a fourth control signal in accordance with said first gain control function.

10. In the system of claim 8, wherein said second means for deemphasizing the corresponding low frequency portions of the encoded signal includes means for separating said encoded signal into said low and high frequency portions, means for sensing the amplitude of selected relatively low frequency components of said encoded signal and for providing a fifth variable control signal logarithmically related to the RMS value of the amplitude of said relatively low frequency components of said encoded signal, means for sensing the amplitude of selected high frequency components of said encoded signal, means for providing a sixth variable control signal logarithmically related to the RMS value of the amplitude of said relatively high frequency components of said encoded signal, and means for comparing said fifth and sixth control signals so as to provide a seventh control signal in accordance with said second gain control function.

11. A method of conditioning an input signal comprising the steps of:

separating said input signal into high and low frequency components;

preemphasizing said low frequency component of said input signal relative to said high frequency component of said input signal in accordance with a first gain control function;

combining the preemphasized low frequency component with said high frequency component to provide a first combined signal;

sensing the amplitude of said combined signal and for providing a first variable D.C. control signal logarithmically related to the RMS value of the amplitude of said combined signal;

amplifying said combined signal by a first gain variable responsively to said first control signal so as to provide an encoded signal;

separating said encoded signal into high and low frequency components;

deemphasizing said low frequency component in accordance with a second gain control function which is substantially the complement of said first gain control function;

combining the deemphasized low frequency component of said encoded signal with the high frequency component of said encoded signal to provide a second combined signal;

sensing the amplitude of said second combined signal and for providing a second variable D.C. control signal logarithmically related to the RMS value of the amplitude of said second combined signal; and amplifying said second combined signal by a second gain variable responsively to said second control signal, said second gain being substantially the complement of said first gain.

12. A method in accordance with claim 11, wherein said step of preemphasizing said low frequency components relative to the high frequency components of said input signal includes the steps of sensing the amplitude of selected relatively low frequency portions of said encoded signal, providing a third variable control signal logarithmically related to the RMS value of the amplitude of said relatively low frequency components, sensing the amplitude of selected high frequency portions of said encoded signal, providing a fourth variable control signal logarithmically related to the RMS value of the amplitude of said relatively high frequency portions and comparing said third and fourth control signals so as to provide a fifth control signal in accordance with said first gain control function.

13. A method in accordance with claim 11, wherein said step of deemphasizing said low frequency components relative to the high frequency components of said encoded signal includes the steps of sensing the amplitude of selected relatively low frequency portions of said encoded signal, providing a sixth variable control signal logarithmically related to the RMS value of the amplitude of said relatively low frequency portions of said encoded signal, sensing the amplitude of selected relatively high frequency portions of said encoded signal, providing a seventh variable control signal logarithmically related to the RMS value of the amplitude of said relatively high frequency portions, and comparing said sixth and seventh control signals so as to provide a eighth control signal in accordance with said second gain control function.

* * * * *